(12) United States Patent
Stewart et al.

(10) Patent No.: US 7,535,039 B1
(45) Date of Patent: May 19, 2009

(54) VERTICALLY INTEGRATED DUAL GATE TRANSISTOR STRUCTURE AND METHOD OF MAKING SAME

(75) Inventors: Eric J. Stewart, Silver Spring, MD (US); Stephen Van Campen, Clarksville, MD (US); Rowland C. Clarke, Sykesville, MD (US)

(73) Assignee: Northrop Grumman Corp, Baltimore, MD (US)

( * ) Notice: Subject to any disclaimer, the term of this patent is extended or adjusted under 35 U.S.C. 154(b) by 117 days.

(21) Appl. No.: 11/453,819

(22) Filed: Jun. 16, 2006

(51) Int. Cl.
*H01L 29/80* (2006.01)
(52) U.S. Cl. .............. 257/264; 257/263; 257/E31.072; 257/E27.148; 257/E29.194; 257/E29.196; 257/E21.401; 257/E21.406

(58) Field of Classification Search .............. 257/264, 257/E31.072, E27.148, E29.194, E29.196, 257/E29.243, E21.401, E21.406, 263
See application file for complete search history.

(56) References Cited

U.S. PATENT DOCUMENTS 4,086,611 A * 4/1978 Nishizawa et al. .......... 257/136

* cited by examiner

*Primary Examiner*—N Drew Richards
*Assistant Examiner*—Tucker Wright
(74) *Attorney, Agent, or Firm*—Fred Frei; Andrews Kurth LLP (57) ABSTRACT

A dual gate power switch comprised of a vertical arrangement of a normally off SIT (static induction transistor) in series with a normally on SIT in a monolithic semiconductor structure. The structure includes a first pillar having at the base thereof laterally extending shoulder portions having sections of a first gate for controlling the normally off SIT. The structure includes a second pillar, of a width greater than the first pillar and which also has laterally extending shoulder portions having sections of a second gate for controlling the normally on SIT. Contacts are provided for SIT operation.

15 Claims, 11 Drawing Sheets

VERTICALLY INTEGRATED DUAL GATE TRANSISTOR STRUCTURE AND METHOD OF MAKING SAME

BACKGROUND OF THE INVENTION

1. Field of the invention

The invention in general relates to semiconductor devices and more particularly to a solid state transistor structure which can be used as an amplifier or as a switch for switching high voltages.

2. Description of Related Art

Power switches are used for switching high voltages and high currents on and off, and are utilized in many arrangements for power conditioning systems such as DC/AC inverter circuits. Ideally, this switching of high voltages could be accomplished by a single normally off device that could both block high voltages in the off state and have low resistance in the on state.

One such candidate is the well-known SIT (static induction transistor. Typically, this device is normally on and is switched off by applying a negative bias to its gate. A normally off SIT can be created by positioning the gate regions of the SIT relatively close together. The normally off SIT however can suffer from relatively high on resistance because the tight spacing between the gate regions creates a very thin channel region. The problem significantly worsens as the normally off blocking voltage is increased. In addition, a single normally off SIT device can have a reduced switching speed due to the large gate to drain capacitance.

The present invention solves the problem by providing a device which can block very high voltages in the off state, provide very low resistance in the on state, and switch at high frequency.

SUMMARY OF THE INVENTION

A monolithic dual gate power transistor structure in accordance with the present invention includes a semiconductor structure having defined therein first and second serial arranged, vertically aligned static induction transistors. As a power switch, the first static induction transistor is a normally off static induction transistor and the second static induction transistor is a normally on static induction transistor. The semiconductor structure has a first pillar of width w with first and second laterally extending shoulder portions at the base thereof. The semiconductor structure also has a second pillar of width W, where W>w, extending down from said first and second laterally extending shoulder portions and having third and fourth laterally extending shoulder portions at the base thereof. The first and second laterally extending shoulder portions include sections of a first gate and the third and fourth laterally extending shoulder portions include sections of a second gate. Contacts are provided for static induction transistor operation.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
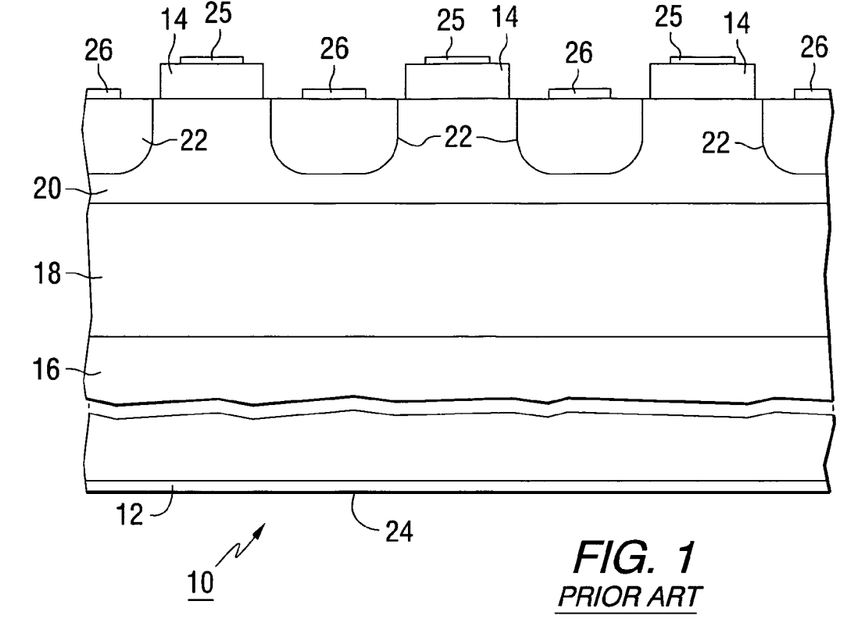
FIG. 1 is a cross sectional view of a typical prior art SIT structure.

Although the principles of the present invention are applicable to amplifiers, it will be described, by way of example, with respect to a high voltage power switch. Referring now to FIG. 1, there is illustrated a SIT 10. A typical SIT is a vertical structure semiconductor device wherein electrical current flows from a drain region 12, to a plurality of source regions 14, on opposite sides of a substrate member 16. The SIT is formed from a plurality of epitaxially grown layers 18 and 20, with sources 14 being formed from a third layer. Current flowing from drain 12 is controlled by a potential barrier induced by gate regions 22 positioned between the sources 14. The region between a source 14 and gates 22 is known as the channel region, while the region between the bottom of the channel region and drain is known as the drift region. Contacts 24, 25 and 26 are provide for making respective electrical contact with the drain 12, sources 14 and gates 22.

Figure 2:
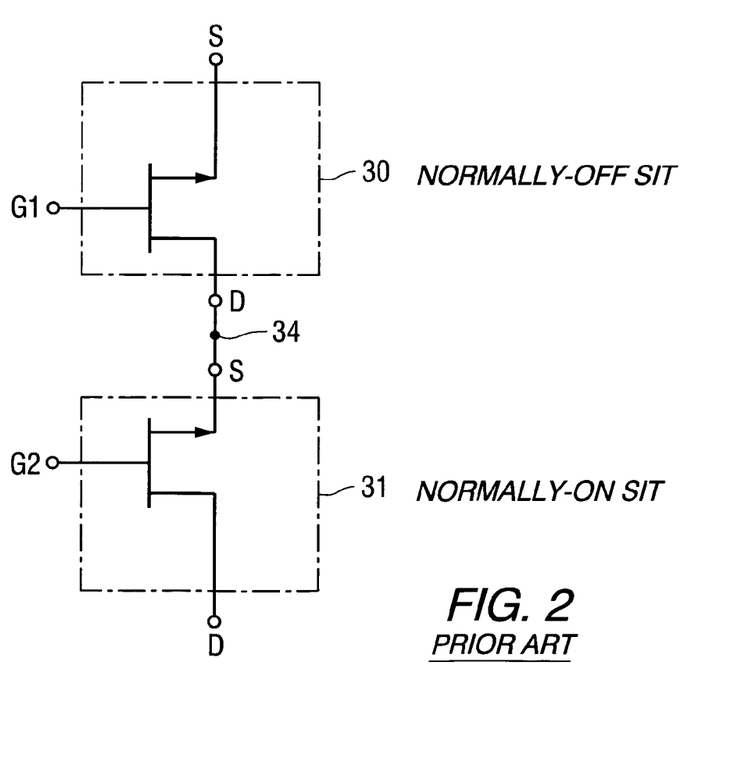
FIG. 2 illustrates a typical prior art arrangement for switching high voltages.

One approach to creating a high voltage, low resistance normally off switch is illustrated in FIG. 2. The arrangement includes two distinct SITs, 30 and 31, with SIT 30 being a normally off SIT and SIT 31 being a normally on SIT. The normally off SIT 30 is designed to block only a relatively small voltage and therefore has a relatively low resistance when turned on. In the off state both gates G1 and G2 are grounded.

By way of example, and not by limitation, let it be assumed that the applied voltage to the drain (D) of normally on SIT 31 is 1000 volts, the normally off SIT 30 is designed to block 50 volts and the normally on SIT 31 is designed to block 1000 volts with with −50 volts applied, gate to source. With 1000 volts applied voltage, when the voltage at the junction point 34 between the SITs reached 50 volts a gate-to-source voltage of negative 50 volts now exists across the normally on SIT 31.

This condition turns off the normally on SIT 31 whereby the full applied voltage is blocked and the arrangement appears as an open circuit.

If a small bias, e.g., 2.5 or 3 volts is applied to the gate G1 of SIT 30, it will turn on and become a short circuit. As a result the voltage at junction point 34 will decrease to around zero and SIT 31 will again turn on. With both SITs acting as short circuits, the combined switch appears as a closed circuit and is now on. The switching action may also be achieved by applying the small bias to both gates G1 and G2 at the same time.

One problem with the arrangement of FIG. 2 is that two distinct devices must be used instead of one. Further, problems, such as unwanted wire inductance, may arise in connecting the two devices together in a circuit.

Figure 3:
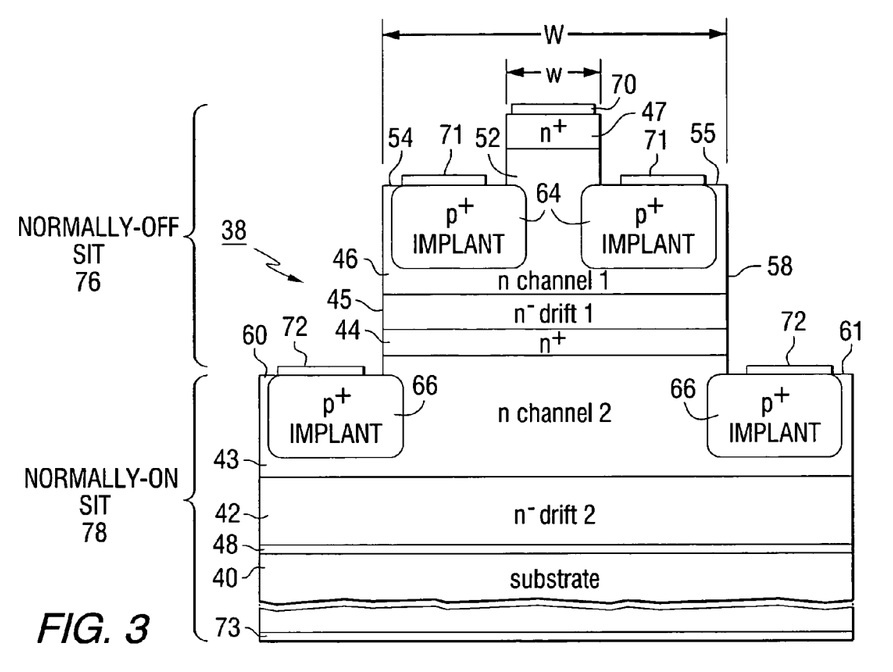
FIG. 3 is a cross sectional view of one embodiment of the present invention.

FIG. 3 illustrates one embodiment of the present invention whereby a normally off SIT is in series with a normally on SIT in a single monolithic semiconductor vertical structure. The semiconductor switch structure 38 includes a substrate 40 upon which is deposited a plurality of epitaxial layers of predetermined conductivity types. These layers are $n^-$ layer 42, n layer 43, $n^+$ layer 44, $n^-$ layer 45, and n layer 46 A source 47 has been formed from a top epitaxial layer, a portion of which has been etched away. If desired, a buffer layer 48 may be formed on the substrate 40 to accommodate any possible defects in the surface of substrate 40 for better matching with the first deposited layer 42.

The structure includes a first pillar 52, of width w which extends down from source 47 and has at the base thereof first and second laterally extending shoulder portions 54 and 55. A second pillar 58, of width W, where W>w, extends down from these shoulder portions 54 and 55 and has at the base thereof third and fourth laterally extending shoulder portions 60 and 61.

Associated with these shoulder portions are respective sections of a first gate 64 and second gate 66 which, by way of example may be ion implanted gates of $p^+$ conductivity. It is to be noted that gates 64 are connected together out of the plane of the Fig. and together constitute the gate electrode of normally off SIT 76. Likewise gates 66 are also connected together and together constitute the gate electrode of normally on SIT 78. The Fig. additionally illustrates contacts 70, 71, 72 and 73 for making connection to respective source, gate and drain regions.

The relatively narrow region between gates 64 constitutes a first channel defined in layer 46, while any remainder of layer 46, as well as layer 45 constitutes a first drift region. Layer 44 is the source for normally on SIT 78 and the region between gates 66 in layer 43 constitutes a second channel. Any remainder of layer 43, as well as layer 42 constitutes a second drift region. Although only a single structure is illustrated in FIG. 3, in actual practice, many such structures are fabricated on a single wafer and one or more of them, in parallel, may be used for voltage switching.

Figure 4:
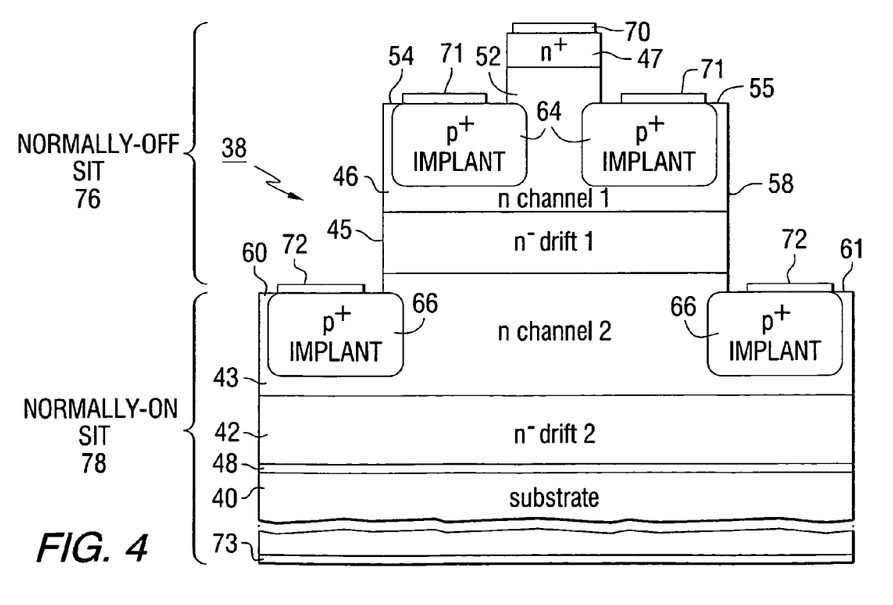
FIGS. 4 and 5 illustrate other embodiments of the present invention.
Figure 5:
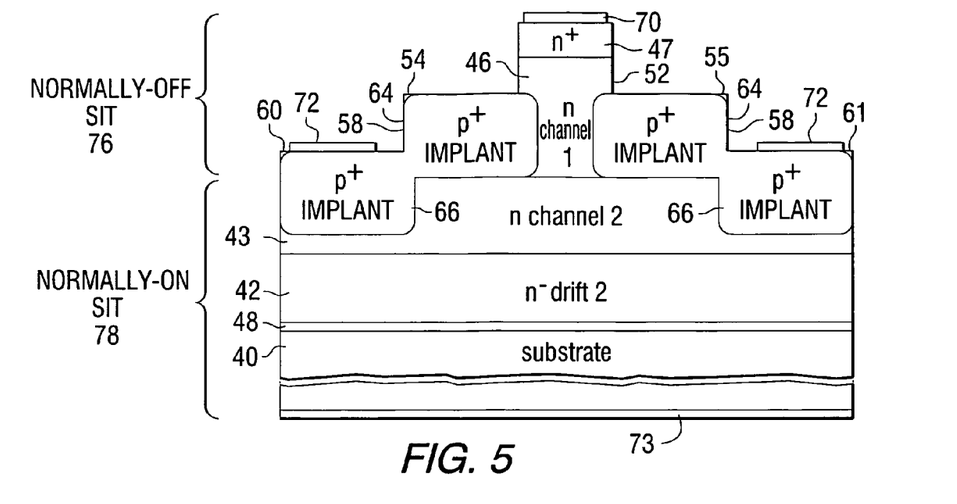

Alternative Embodiments of the structure of FIG. 3 are illustrated in FIGS. 4 and 5. In FIG. 4 source layer 44 has been eliminated such that drift layer 45 serves as the source for normally on SIT 78. In the arrangement of FIG. 4 gate sections 64 are vertically displaced from gate sections 66. In FIG. 5 both source layer 44 as well as drift layer 45 have been eliminated. Although the device of FIG. 5 may not operate quite as well as the device of FIG. 3, it may be desirable since it is easier to fabricate. In the embodiment of FIG. 5, with the removal of layers 44 and 45, the gate sections 64 and 66 now touch one another and will require only one contact, 72. Any applied bias voltage will therefore be applied to both gates.

One method of fabricating the device of FIG. 3 is illustrated in FIGS. 6 to 10, although the principles of fabrication are equally applicable to the embodiments of FIGS. 4 and 5. The structure 80 illustrated in FIG. 6 includes the substrate 40 as well as all of the epitaxial layers 42-48. A top epitaxial layer 47' will form the source 47. After deposition of all the epitaxial layers, a first mask 82 is deposited, leaving exposed areas 84 and 85 on either side of the mask 82.

Figure 7:
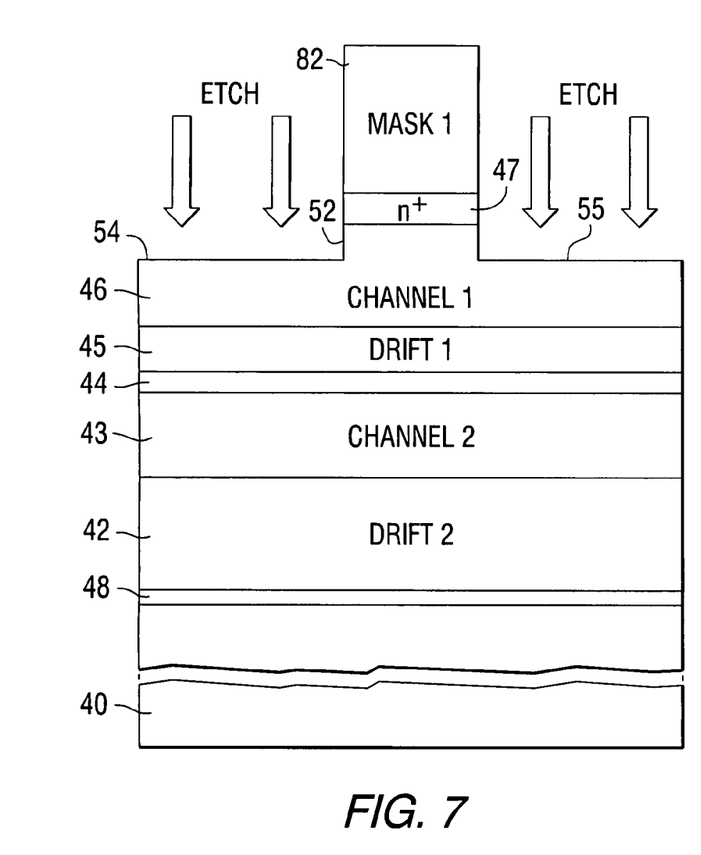
Figure 8:
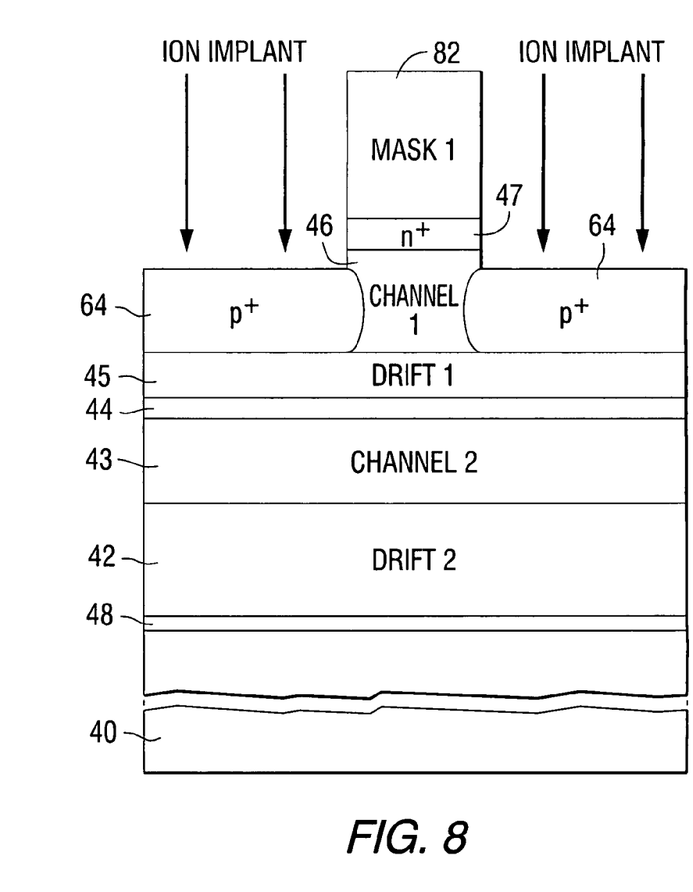

As illustrated in FIG. 7, the exposed areas 84 and 85 of structure 80 is then subjected to an etching process, such as an RIE (reactive ion etch), to etch down a predetermined distance to thus define source 47, first pillar 52 and laterally extending shoulder portions 54 and 55. Gate sections 64 are then ion implanted, as illustrated in FIG. 8.

Figure 9:
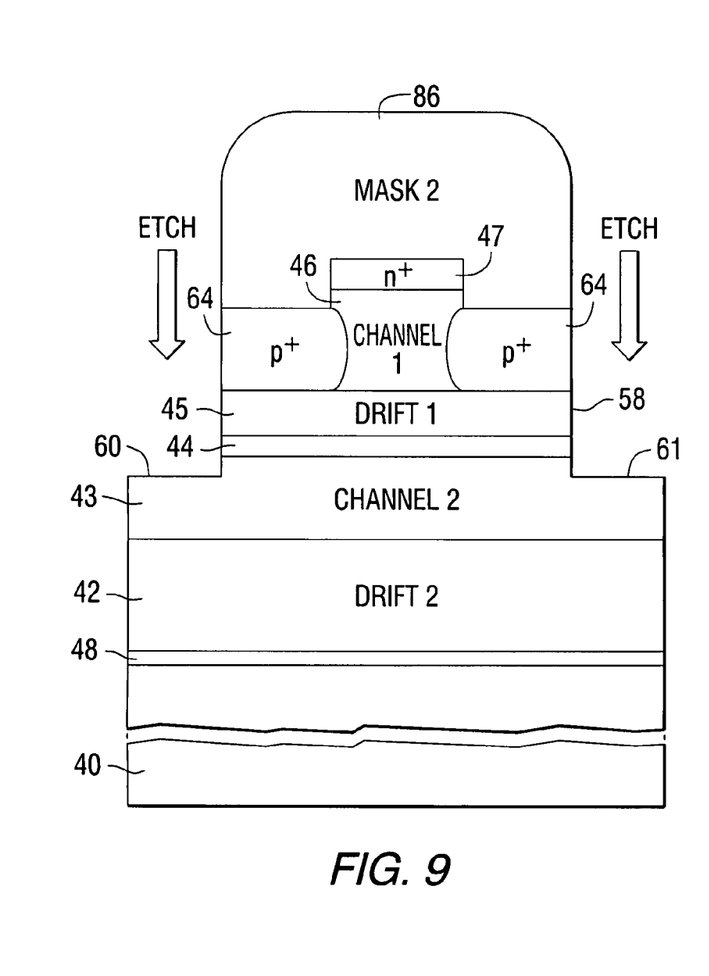
Figure 10:
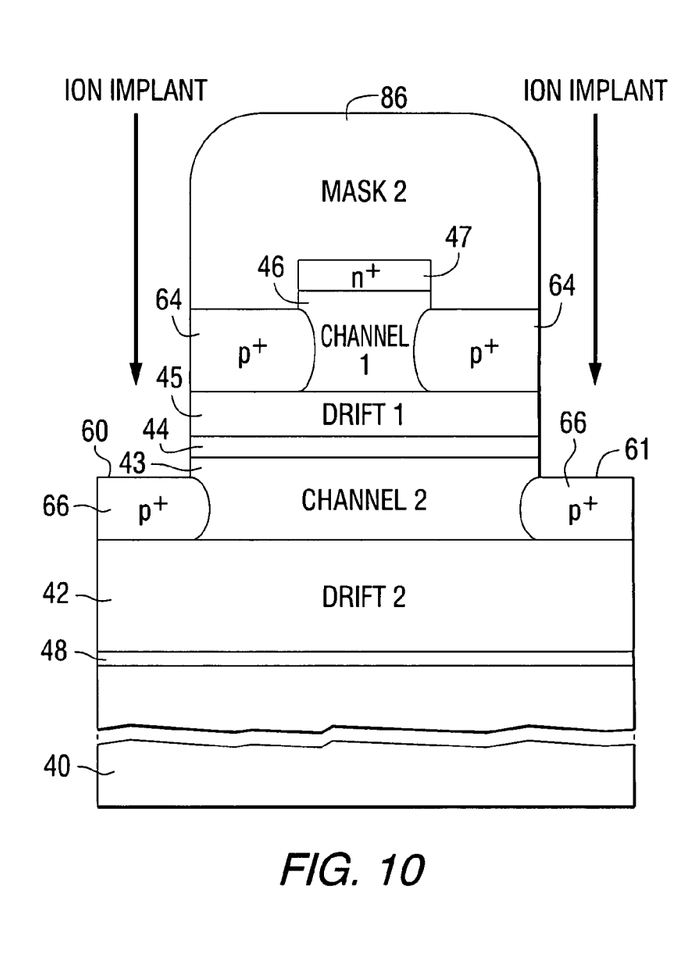

The first mask 82 is removed and, as illustrated in FIG. 9, a second mask 86 is deposited over the source 47 and over a portion of gate sections 64. The structure is then subjected to another RIE to thus form the second pillar 58 with laterally extending shoulder portions 60 and 61. Gate sections 66 are then ion implanted, as illustrated in FIG. 10. The second mask 86 is removed and appropriate contacts are applied resulting in the vertically aligned, dual SIT structure of FIG. 3.

Figure 6:
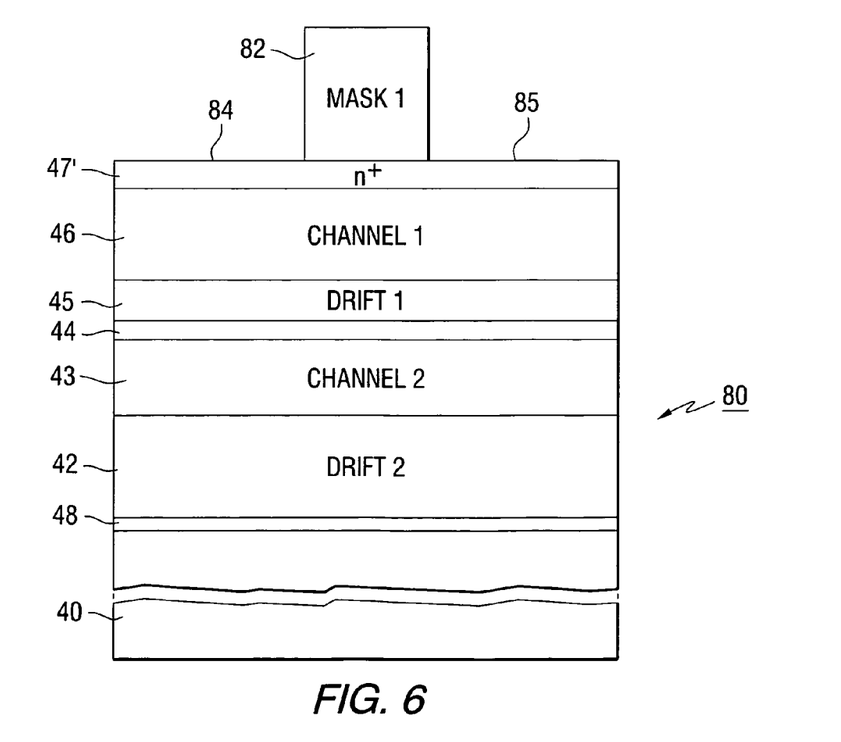
FIGS. 6-10 illustrate one method of fabrication of the present invention.
Figure 11:
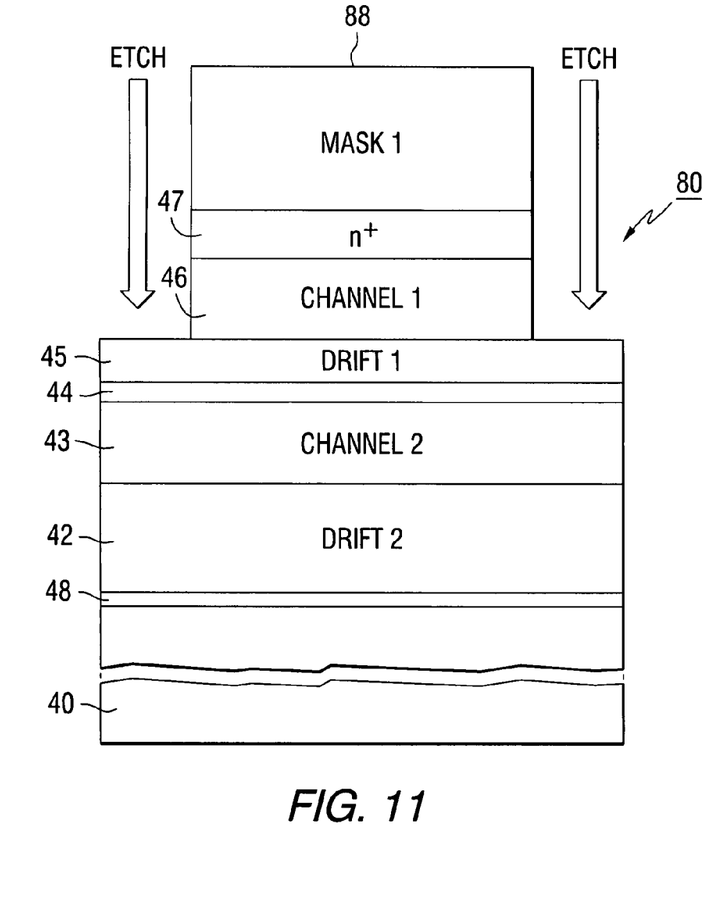
FIGS. 11-13 illustrate another method.
Figure 12:
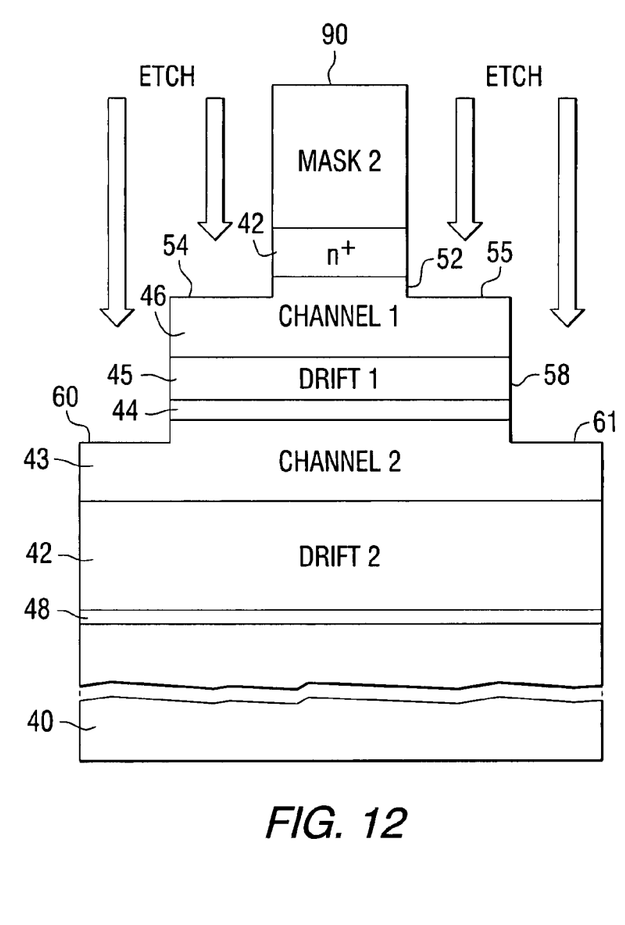
Figure 13:
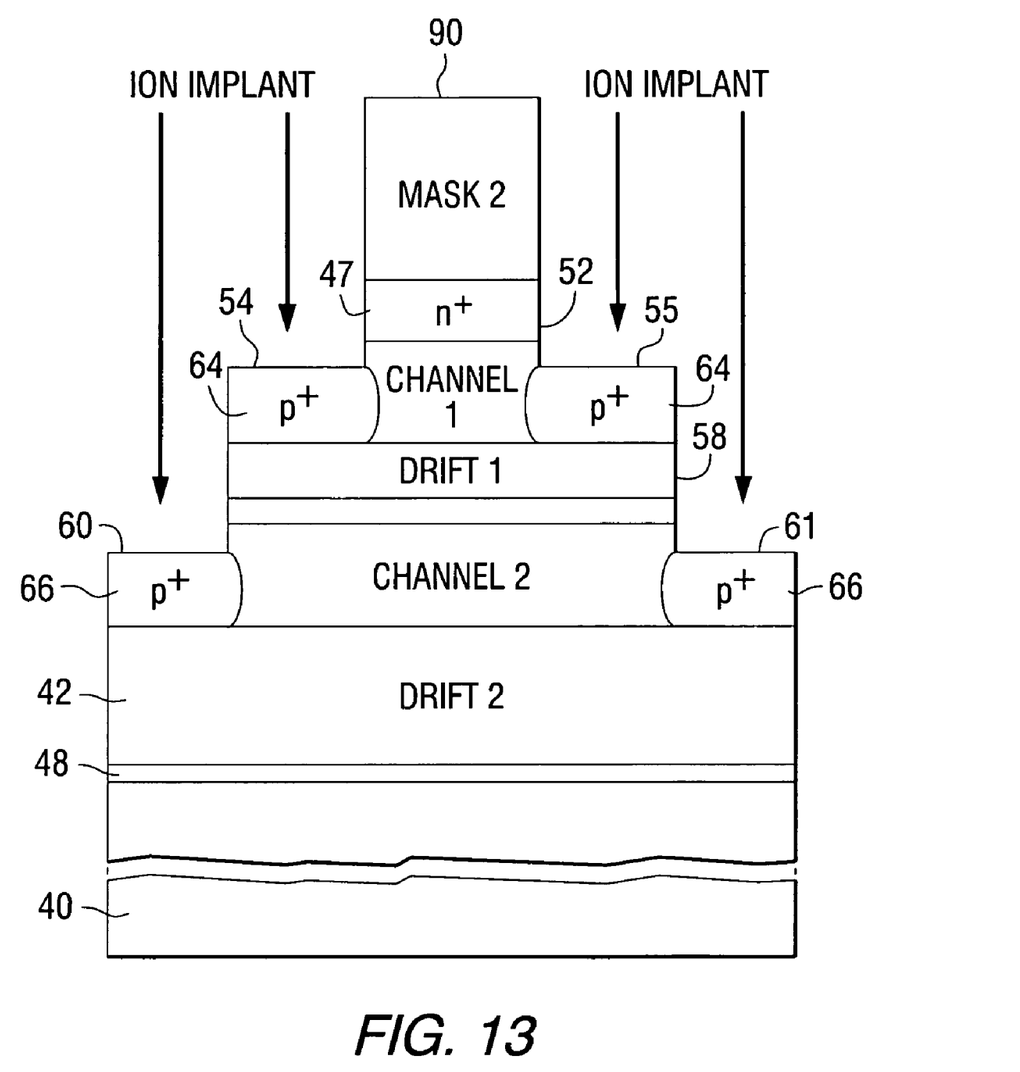

Another method of fabricating the vertically aligned, dual SIT structure of FIG. 3 is illustrated in FIGS. 11 to 13. Starting with the structure 80 of FIG. 6, and, as illustrated in FIG. 11, a first mask 88 somewhat wider than first mask 82 of FIG. 6 is applied to the top surface of the structure. An RIE then removes material down to a predetermined depth to the top of layer 45.

First mask 88 is removed and a second, and narrower mask 90 is deposited, as shown in FIG. 12. A second RIE then removes material down to a point just below the top of layer 43 thereby defining the source 47, first pillar 52, laterally extending shoulder portions 54 and 55, the second pillar 58 and its laterally extending shoulder portions 60 and 61.

As illustrated in FIG. 13, ion implantation then takes place to define gate sections 64 and 66 in only a single ion implantation procedure, as opposed to two separate implantations, as in FIGS. 8 and 10. After implantation of the gates, the second mask 90 is removed and appropriate contacts are applied resulting in the vertically aligned, dual SIT structure of FIG. 3.

Figure 14:
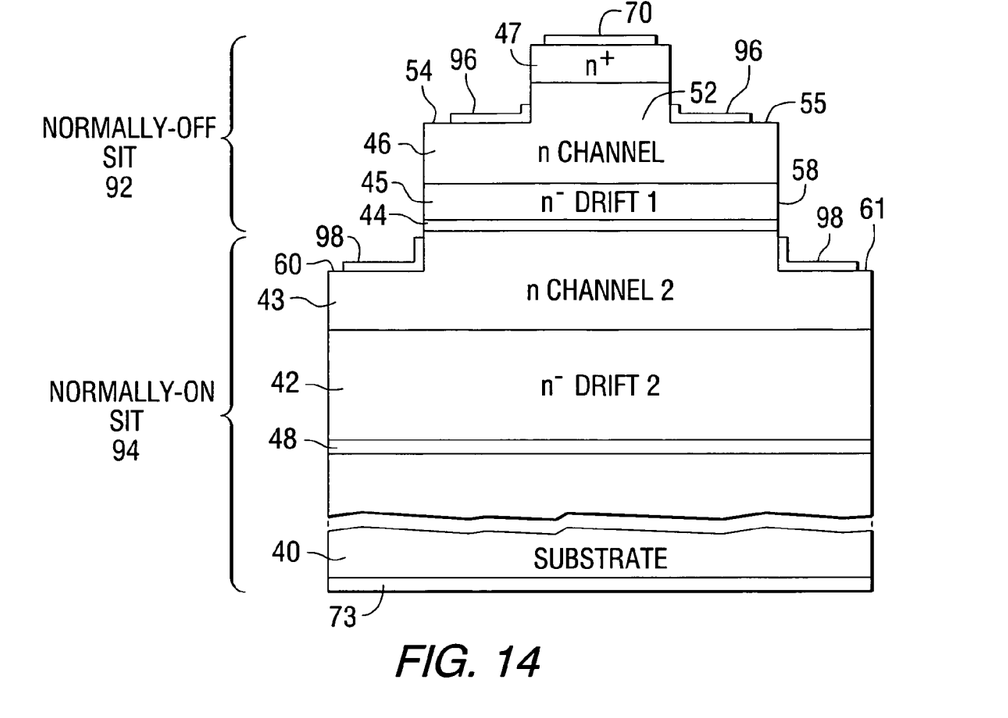
FIG. 14 shows an alternative gate arrangement.

In the embodiment of FIG. 3 the gate sections 64 and 66 are ion implanted, by way of example. FIG. 14 illustrates vertically aligned dual SITs, namely, normally off SIT 92 and normally on SIT 94 with an alternative gate arrangement. More particularly, first gate sections 96 of normally off SIT 92 and second gate sections 98 of normally on SIT 94 are well-known Schottky gates. That is they form a metal-to-semiconductor interface, with Schottky gate sections 96 being positioned on shoulder portions 54 and 55, and slightly extending up the side walls of pillar 52. Similarly, Schottky gate sections 98 are positioned on shoulder portions 60 and 61, and slightly extend up the side walls of pillar 58.

Figure 15A:
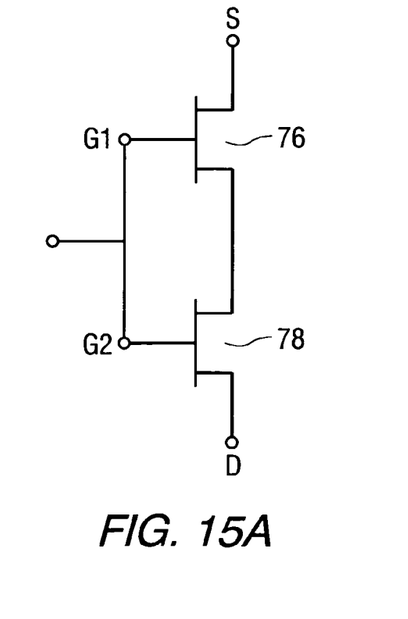
FIGS. 15A and 15B are electrical schematics of different gate configurations.
Figure 15B:
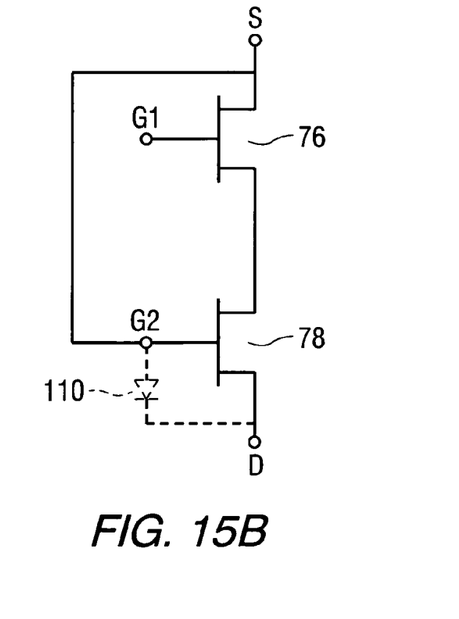

Although the dual gate switch of the present invention is a monolithic unitary structure, it may be schematically represented by the circuits of FIGS. 15A and 15B. FIG. 15A illustrates one mode of operation wherein both gates G1 and G2 of the SITs are tied together such that a bias voltage is applied to both normally off SIT 76 as well as to normally on SIT 78.

FIG. 15B illustrates a preferred arrangement wherein only the gate G1 of normally off SIT 76 receives the bias voltage whereas the gate G2 of normally on SIT 78 is tied to the source of normally off SIT 76. This arrangement is known as a cascode configuration and has two advantages over that of FIG. 15A. One advantage is that it switches faster because only the normally off gate G1, and the capacitance associated with it, has to be driven instead of both gates. This is advantageous since for a high voltage device the capacitance of the normally on gate G2 is much larger than the normally off gate.

Another advantage is useful in systems which include an inductive component. More particularly, the arrangement of FIG. 15B forms, what is called an anti-parallel diode between the source of the normally off SIT 76 which is connected to gate G2, and the drain of the normally on SIT 78. This diode is indicated by the numeral 110.

If, for example, four switches are used in a full-bridge DC to AC converter, a particular load would include an inductive component. If a chosen two of the switches are closed, with the other two being open, current will flow through the load in one direction. When the other two switches are closed and the first two opened, current will then flow through the load in an opposite direction.

Figure 16:
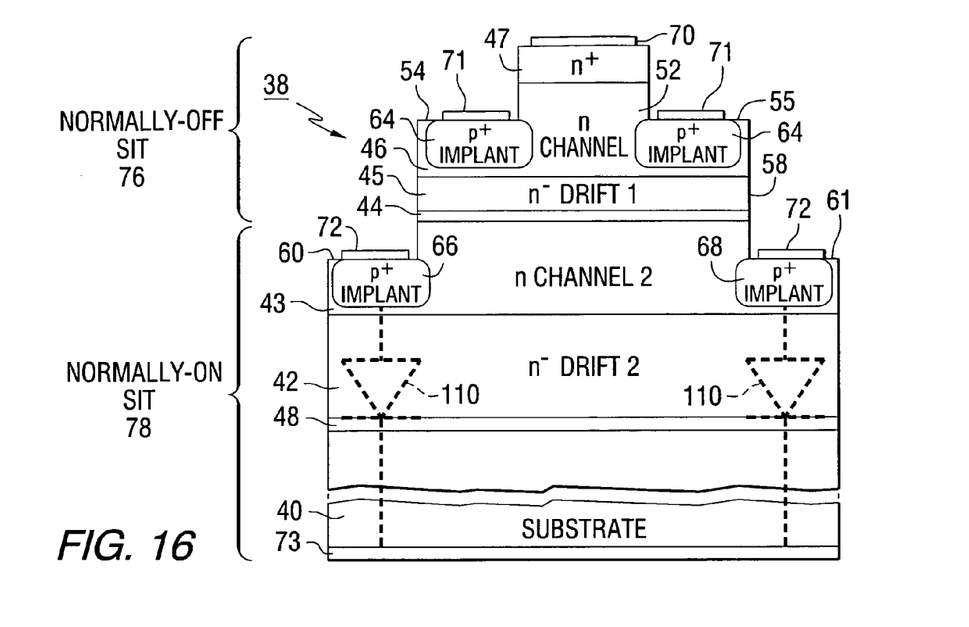
FIG. 16 illustrates the device with anti-parallel diodes.

Current through an inductor however cannot be switched back and forth instantaneously. That is, it must be discharged for a time before it can flow in an opposite direction. The anti-parallel diode allows this discharge to take place by flowing the current through the switch in a direction opposite to the normal current when the switch is open. Often circuit designers will use a separate discrete diode to function as an anti-parallel diode. In the present invention with the cascode arrangement of FIG. 15B, the anti-parallel diode is built into the switch itself, as indicated in FIG. 16.

Figure 17:
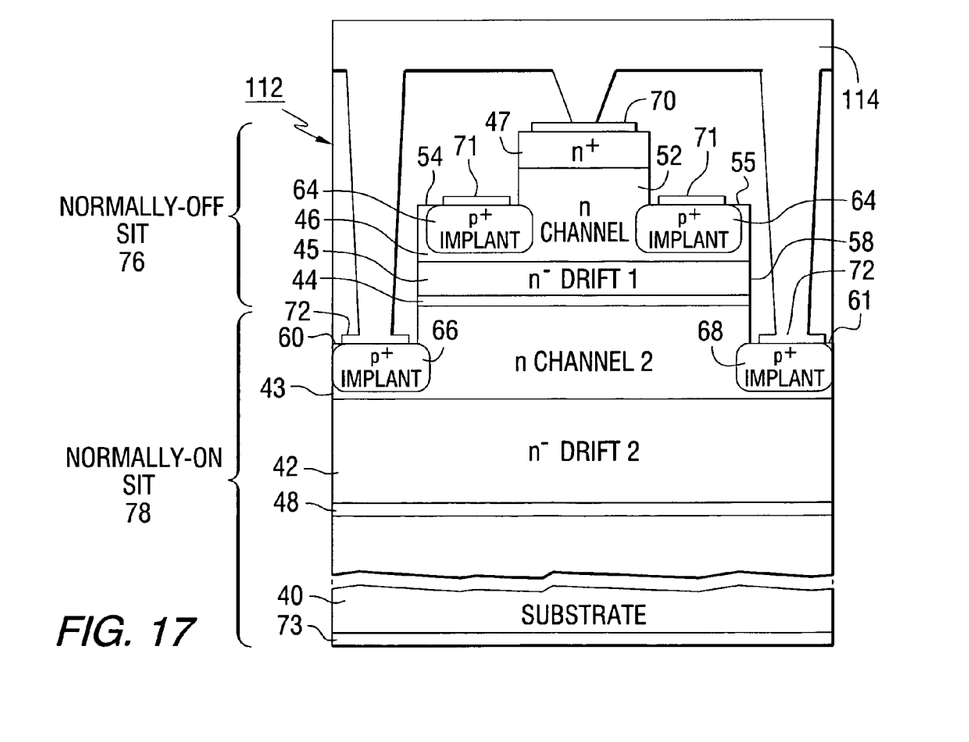
FIG. 17 illustrates the device with a certain metallization.

FIG. 17 illustrates a method for electrically connecting the source 47 of normally off SIT 76 to the gate 66 of normally on SIT 78. Starting with arrangement of FIG. 3, the structure may be covered with an insulator 112. Appropriate apertures are formed in the insulator 112 and a metallization 114 is deposited thereby making the required electrical connection.

Figure 18:
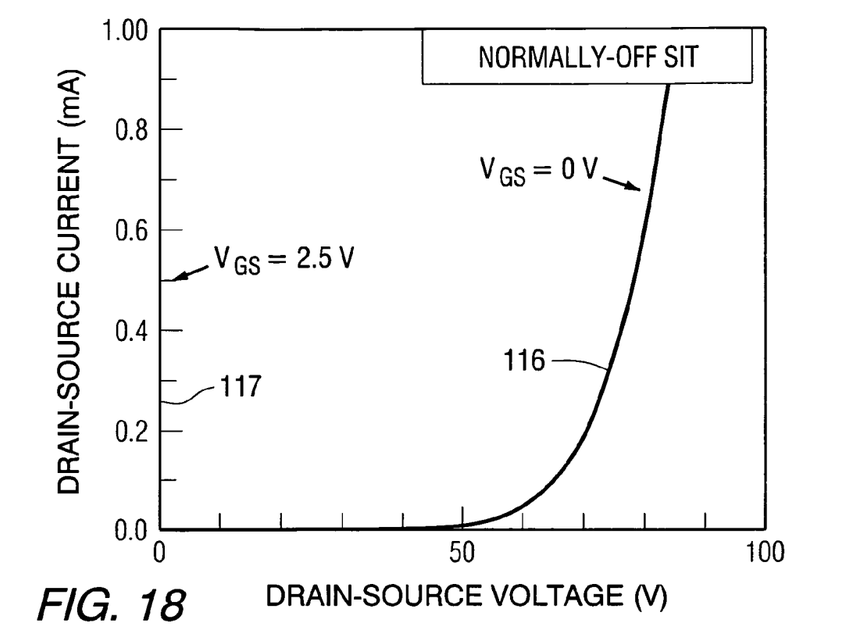
FIGS. 18 to 20 are curves illustrating operation of the switch of FIG. 3.
Figure 19:
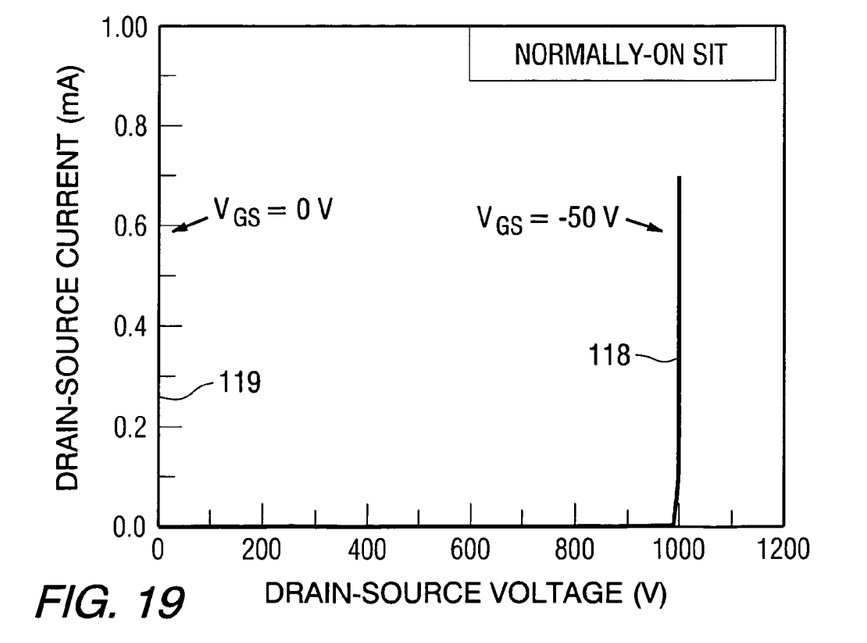

FIGS. 18 and 19 illustrate a set of computer generated curves showing the drain-source current vs. drain-source voltage for the normally off SIT and the normally on SIT, respectively. In FIG. 18, the normally off SIT is rated at 50 volts. As a result, curve 116 illustrates that with zero gate bias no drain-source current flows up to the rated 50 volts. If a positive bias is applied, curve 117 illustrates that conduction occurs and the SIT becomes a short circuit.

In FIG. 19, the normally on SIT is rated at 1000 volts. If a negative 50 volt bias is applied as indicated by curve 118 then the device will pinch off and block up to its 1000 volt rating. With a zero or small bias, conduction will occur and the SIT becomes a short circuit, as illustrated by curve 119. It is noted that the 50 volt and 1000 volt rating are illustrated by way of example and that in practice, a switch could be designed for a variety of voltage ratings.

Figure 20:
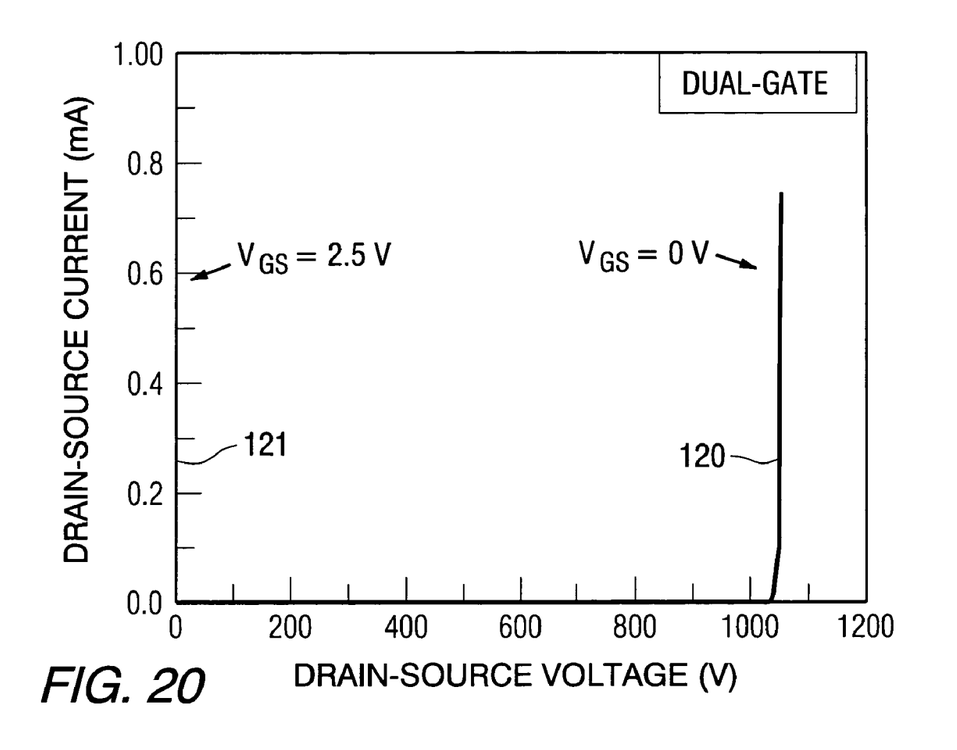

FIG. 20 illustrates the characteristic curve for the combined device. The negative 50 volts is no longer needed to block the 1000 volts and curve 120 illustrates that the device will block 1000 volts with no gate bias applied. With a small applied bias, curve 121 indicates that full conduction occurs. The net result is to have high voltage, normally off device.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A monolithic dual gate transistor structure, comprising:
a semiconductor structure having defined therein first and second serial arranged, vertically aligned static induction transistors;
said structure having a first pillar of width w and having first and second laterally extending shoulder portions at the base thereof;
said structure having a second pillar of width W, where W>w, extending down from said first and second laterally extending shoulder portions and having third and fourth laterally extending shoulder portions at the base thereof;
said first and second laterally extending shoulder portions having sections of a first gate; and
said third and fourth laterally extending shoulder portions having sections of a second gate; and
a plurality of contacts at various locations on said semiconductor structure for obtaining static induction transistor operation, wherein;
said first static induction transistor is a normally off static induction transistor and said second static induction transistor is a normally on static induction transistor, wherein;
said semiconductor structure includes a substrate having a plurality of epitaxial layers of predetermined conductivity types thereon;
a top one of said layers defining a source for said normally off static induction transistor;
said source being located at the top of said first pillar;
a next adjacent said layer defining a channel region for said normally off static induction transistor;
a next adjacent said layer defining a drift region for said normally off static induction transistor;
a next adjacent said layer defining a source for said normally on static induction transistor;
a next adjacent said layer defining a channel region for said normally on static induction transistor; and
a next adjacent said layer defining a drift region for said normally off static induction transistor.

2. Apparatus according to claim 1 wherein:
said first and second gates are ion implanted gates.

3. Apparatus according to claim 1 wherein:
said first and second gates are Schottky gates.

4. Apparatus according to claim 1 wherein:
said semiconductor structure includes a substrate having a plurality of epitaxial layers of predetermined conductivity types thereon;
a top one of said layers defining a source for said normally of static induction transistor;
said source being located at the top of said first pillar;
a next adjacent said layer defining a channel region for said normally off static induction transistor;
a next adjacent said layer defining a drift region for said normally off static induction transistor;
said drift region acting as a source for said normally on static induction transistor;
a next adjacent said layer defining a channel region for said normally on static induction transistor; and
a next adjacent said layer defining a drift region for said normally off static induction transistor.

5. Apparatus according to claim 1, wherein:
said semiconductor structure includes a substrate having a plurality of epitaxial layers of predetermined conductivity types thereon;
a top one of said layers defining a source for said normally off static induction transistor;
said source being located at the top of said first pillar;
a next adjacent said layer defining a channel region for said normally off static induction transistor;
said channel region acting as a source for said normally on static induction transistor;

a next adjacent said layer defining a channel region for said normally on static induction transistor; and a next adjacent said layer defining a drift region for said normally off static induction transistor;

said first gates being in contact with said second gates.

6. Apparatus according to claim 1 wherein:

said normally off static induction transistor includes a source, a gate and a drain;

said normally on static induction transistor includes a source, a gate and a drain; and wherein said gate of said normally on static induction transistor is electrically connected to said source of said normally off static induction transistor.

7. A method of making a monolithic dual gate power switch, comprising the steps of:

providing a semiconductor structure having a substrate with a plurality of epitaxial layers of predetermined conductivity types thereon;

forming first and second serially arranged pillars in said semiconductor structure, with said first pillar on top and having a width w, and said second pillar underneath said first pillar and having a width W, where W>w;

the formation of said first pillar defining first and second laterally extending shoulder portions at the base thereof;

the formation of said second pillar defining third and fourth laterally extending shoulder portions at the base thereof;

forming sections of a first gate at said first and second laterally extending shoulder portions of said first pillar;

forming sections of a second gate at said third and fourth laterally extending shoulder portions of said second pillar;

providing contacts on the top one of said epitaxial layers, on at least one of said first or second gates and on the back of sad substrate to form a first static induction transistor utilizing said first pillar and to form a second static induction transistor utilizing said second pillar.

8. A method according to claim 7 which includes the steps of:

forming said sections of said first and second gates by ion implantation.

9. A method according to claim 7 which includes the step of:

forming said sections of said first and second gates with Schottky gates.

10. A method according to claim 7 which includes the step of:

forming said pillars by reactive ion etching.

11. A method according to claim 7 which includes the step of:

forming said first pillar first.

12. A method according to claim 7 which includes the step of:

forming said second pillar first.

13. A method according to claim 7 which includes the step of:

providing a predetermined number of said epitaxial layers such that said sections of said first gate touch said sections of said second gate.

14. A method according to claim 13 which includes the steps of:

forming said sections of said first gate simultaneous with said sections of said second gate.

15. A method according to claim 7 which includes the step of:

providing a predetermined number of said epitaxial layers such that said sections of said first gate are vertically displaced from said sections of said second gate.

* * * * *